United States Patent
Onogi et al.

(10) Patent No.: US 10,141,411 B2
(45) Date of Patent: Nov. 27, 2018

(54) TEMPERATURE SENSING SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Atsushi Onogi, Toyota (JP); Toru Onishi, Nagoya (JP); Shuhei Mitani, Kariya (JP); Yusuke Yamashita, Nagakute (JP); Katsuhiro Kutsuki, Nagakute (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/435,833

(22) Filed: Feb. 17, 2017

(65) Prior Publication Data
US 2017/0271457 A1  Sep. 21, 2017

(30) Foreign Application Priority Data
Mar. 18, 2016  (JP) .................. 2016-056180

(51) Int. Cl.
| | | |
|---|---|---|
| H01L 29/16 | (2006.01) | |
| G01K 7/01 | (2006.01) | |
| G01K 7/02 | (2006.01) | |
| H01L 27/07 | (2006.01) | |
| H01L 29/78 | (2006.01) | |

(Continued)

(52) U.S. Cl.
CPC .......... *H01L 29/1608* (2013.01); *G01K 7/01* (2013.01); *G01K 7/015* (2013.01); *G01K 7/028* (2013.01); *H01L 23/34* (2013.01); *H01L 27/0255* (2013.01); *H01L 27/0716* (2013.01); *H01L 27/2454* (2013.01); *H01L 29/083* (2013.01); *H01L 29/1095* (2013.01); *H01L 29/6606* (2013.01); *H01L 29/7397* (2013.01); *H01L 29/7804* (2013.01); *H01L 29/7813* (2013.01);
(Continued)

(58) Field of Classification Search
CPC ...... H01L 23/34; H01L 29/861–29/885; H01L 29/66136; H01L 29/1608; H01L 29/7804; H01L 27/0716; H01L 29/8611; H01L 2924/12036; H01L 27/0255; G01K 7/01; G01K 7/028; G01K 7/015
See application file for complete search history.

(56) References Cited

U.S. PATENT DOCUMENTS

2015/0207407 A1* 7/2015 Nishiwaki ............... H01L 23/34
                                                              323/271

FOREIGN PATENT DOCUMENTS

| JP | 2008-235600 A | 10/2008 |
|---|---|---|
| JP | 2013-201357 A | 10/2013 |

* cited by examiner

*Primary Examiner* — Phat X Cao
*Assistant Examiner* — Diana C Vieira
(74) *Attorney, Agent, or Firm* — Oliff PLC

(57) ABSTRACT

A semiconductor device includes a semiconductor substrate of silicon carbide, and a temperature sensor portion. The semiconductor substrate includes a portion in which an n-type drift region and a p-type body region are laminated. The temperature sensor portion is disposed in the semiconductor substrate and is separated from the drift region by the body region. The temperature sensor portion includes an n-type cathode region being in contact with the body region, and a p-type anode region separated from the body region by the cathode region.

2 Claims, 3 Drawing Sheets

(51) Int. Cl.
*H01L 27/24* (2006.01)
*H01L 29/66* (2006.01)
*H01L 27/02* (2006.01)
*H01L 29/10* (2006.01)
*H01L 29/08* (2006.01)
*H01L 23/34* (2006.01)
*H01L 29/739* (2006.01)
*H01L 29/861* (2006.01)

(52) U.S. Cl.
CPC . *H01L 29/8611* (2013.01); *H01L 2924/12036* (2013.01)

TEMPERATURE SENSING SEMICONDUCTOR DEVICE

CROSS-REFERENCE TO RELATED APPLICATION

This application claims priority to Japanese Patent Application No. 2016-056180 filed on Mar. 18, 2016, the entire contents of which are hereby incorporated by reference into the present application.

TECHNICAL FIELD

A technique disclosed herein relates to a semiconductor device.

DESCRIPTION OF RELATED ART

Japanese Patent Application Publication No. 2013-201357 discloses a semiconductor device including a temperature sensor portion. The temperature sensor portion is provided on an isolation insulating film that covers a front surface of a semiconductor substrate, and is configured as a pn-diode. The pn-diode is formed by p-type impurities and n-type impurities being introduced into polysilicon that covers the isolation insulating film. The temperature sensor portion is configured to detect a temperature of the semiconductor device by using a temperature dependency of a forward voltage of the pn-diode. This type of temperature sensor portion has a problem that when the polysilicon constituting the pn-diode is covered with an interlayer insulating film, corner portions of the polysilicon are difficult to be covered well with the interlayer insulating film (coverage defect).

Japanese Patent Application Publication No. 2008-235600 discloses a technique for providing a temperature sensor portion in a semiconductor substrate. A pn-diode of the temperature sensor portion is embedded in the semiconductor substrate in a state of being covered with an insulating film. The technique of Japanese Patent Application Publication No. 2008-235600 can avoid the above-described problem of the coverage defect.

SUMMARY

The pn-diode of the temperature sensor portion disclosed in Japanese Patent Application Publication No. 2008-235600, is embedded in the semiconductor substrate in a state of being covered with the insulating film. In this type of temperature sensor portion, the insulating film becomes a thermal resistance, and thus the temperature sensor portion cannot quickly follow temperature change in the semiconductor substrate, resulting in a low responsivity of the temperature sensor portion. The present teachings aim to provide a semiconductor device that includes a temperature sensor portion with a high responsivity.

The semiconductor device according to one aspect of the present teachings comprises a semiconductor substrate of silicon carbide and a temperature sensor portion. The semiconductor substrate includes a portion in which a drift region of an n-type and a body region of a p-type are laminated. The temperature sensor portion is disposed in the semiconductor substrate and is separated from the drift region by the body region. The temperature sensor portion comprises a cathode region of the n-type and an anode region of the p-type. The cathode region is in contact with the body region; and the anode region is separated from the body region by the cathode region.

In the temperature sensor portion according to the above-mentioned aspect, the cathode region is in direct contact with the body region of the semiconductor substrate. That is, a pn-diode of the temperature sensor portion is not covered with an insulating film. Due to this, since there is nothing that constitutes a thermal resistance between the pn-diode of the temperature sensor portion and the semiconductor substrate, the temperature sensor portion can have a high responsivity. Moreover, since a reverse pn-diode is constituted between the cathode region and the body region, a current that flows in the pn-diode of the temperature sensor portion can be suppressed from leaking into the body region. For this reason, a situation where temperature detection of the temperature sensor portion becomes inaccurate due to a leak current, can be suppressed. Moreover, in the above-mentioned semiconductor device, the semiconductor substrate is constituted of silicon carbide. The semiconductor substrate of silicon carbide has a feature of having a low diffusion coefficient of impurities. Due to this, impurities included in the cathode and anode regions that constitute the pn-diode of the temperature sensor portion can be suppressed from diffusing into the semiconductor substrate. Due to this, the pn-diode of the temperature sensor portion has a high robustness against variations in temperature condition during the manufacturing process, and can obtain a desired temperature detecting property. For example, in a semiconductor substrate constituted of silicon if the pn-diode of the temperature sensor portion is in direct contact with the semiconductor substrate, impurities included in the cathode and anode regions that constitute the pn-diode of the temperature sensor portion diffuse into the semiconductor substrate. Due to this, the pn-diode of the temperature sensor portion can vary in its shape depending on variations in the temperature condition during the manufacturing process. Due to this, the temperature detecting property of the temperature sensor portion may fluctuate depending on the temperature condition during the manufacturing process. In other words, in the semiconductor substrate constituted of silicon, the pn-diode of the temperature sensor portion needs to be covered with an insulating film in order to obtain a desired shape thereof. On the other hand, in the semiconductor device according to the above-mentioned aspect, since silicon carbide is employed as a material of the semiconductor substrate, even if the pn-diode of the temperature sensor portion is in direct contact with the semiconductor substrate, a desired shape of the pn-diode can be obtained independently of the variations in the temperature condition during the manufacturing process. Thus, the temperature sensor portion of the semiconductor device according to the above-described aspect can obtain a stable temperature detecting property. That is, the temperature sensor portion of the semiconductor device according to the above-described aspect can have a high responsivity and a stable temperature detecting property by employing silicon carbide for a material of the semiconductor substrate.

DETAILED DESCRIPTION

Figure 1:
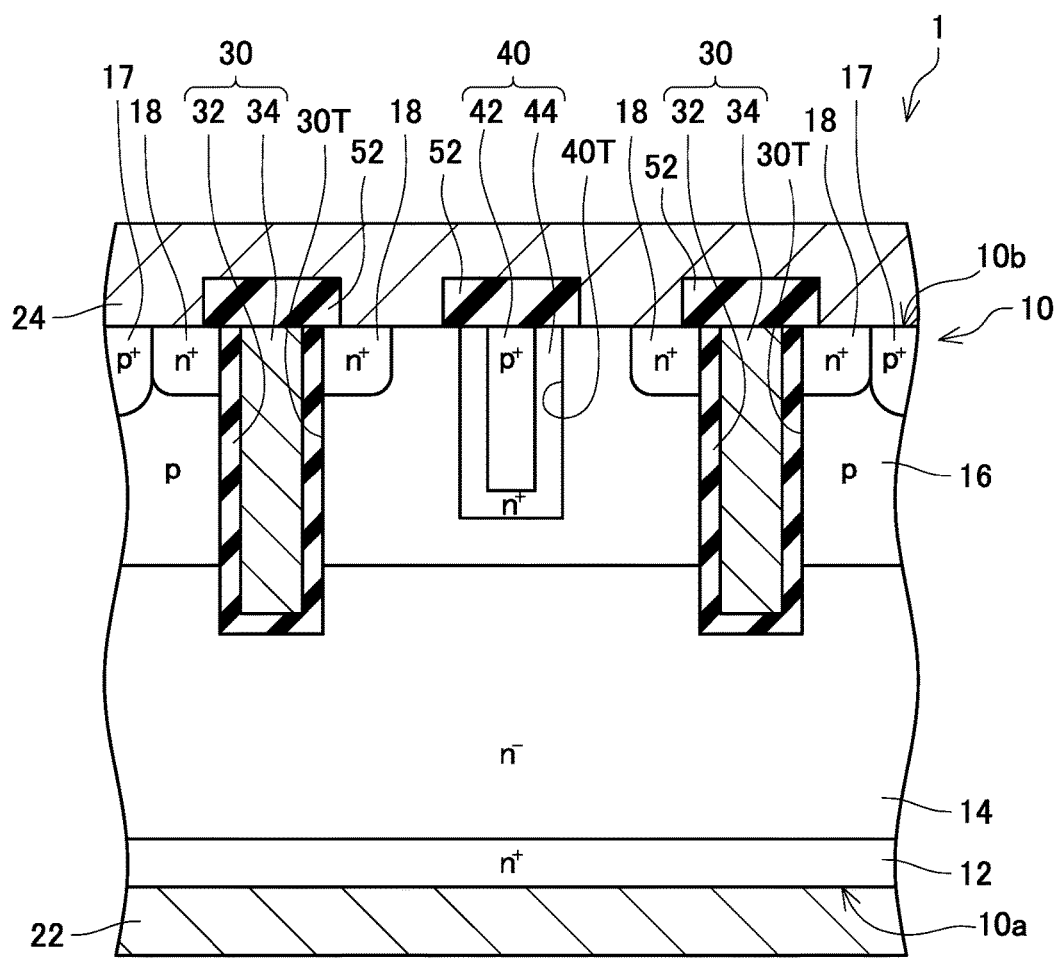
FIG. 1 schematically shows a cross section of a main part of a semiconductor device disclosed herein, taken along a line I-I of FIG. 2.

As shown in FIG. 1, a semiconductor device 1 is a power semiconductor device called a MOSFET (Metal-Oxide-Semiconductor Field-Effect Transistor), and comprises a semiconductor substrate 10, a drain electrode 22 that covers a rear surface 10a of the semiconductor substrate 10, a source electrode 24 that covers a front surface 10b of the semiconductor substrate 10, and a plurality of trench gates 30 provided in a front layer portion of the semiconductor substrate 10. The plurality of trench gates 30 is arranged in stripes viewed along a direction orthogonal to the front surface 10b of the semiconductor substrate 10 (see FIG. 2).

The semiconductor substrate 10 is a substrate, a material of which is silicon carbide (SiC), and includes an n$^+$-type drain region 12, an n$^-$-type drift region 14, a p-type body region 16, p$^+$-type body contact regions 17, and n$^+$-type source regions 18.

The drain region 12 is disposed in a rear layer portion of the semiconductor substrate 10, and is exposed on the rear surface 10a of the semiconductor substrate 10. The drain region 12 also serves as a ground substrate on which the drift region 14, which will be described below, epitaxially grows. The drain region 12 is in ohmic contact with the drain electrode 22 that covers the rear surface 10a of the semiconductor substrate 10.

The drift region 14 is provided on the drain region 12. The drift region 14 is in contact with bottom surfaces and side surfaces of the trench gates 30. The drift region 14 is formed by growing as a crystal from a surface of the drain region 12 through an epitaxial growth technique. The drift region 14 has an impurity concentration that is constant along a thickness direction of the semiconductor substrate 10.

The body region 16 is provided on the drift region 14, and is disposed in the front layer portion of the semiconductor substrate 10. The body region 16 is in contact with side surfaces of the trench gates 30. The body region 16 is formed by growing as a crystal from a surface of the drift region 14 through an epitaxial growth technique.

The body contact regions 17 are provided on the body region 16, are disposed in the front layer portion of the semiconductor substrate 10, and are exposed on the front surface 10b of the semiconductor substrate 10. Each body contact region 17 is formed by introducing aluminum into the front layer portion of the semiconductor substrate 10 through an ion implantation technique. Each body contact region 17 is in ohmic contact with the source electrode 24 that covers the front surface 10b of the semiconductor substrate 10.

The source regions 18 are provided on the body region 16, are disposed in the front layer portion of the semiconductor substrate 10, and are exposed on the front surface 10b of the semiconductor substrate 10. Each source region 18 is separated from the drift region 14 by the body region 16. Each source region 18 is in contact with a side surface of the corresponding trench gate 30. The source region 18 is formed by introducing nitride or phosphorus into the front layer portion of the semiconductor substrate 10 through the ion implantation technique. The source region is in ohmic contact with the source electrode 24 that covers the front surface 10b of the semiconductor substrate 10.

Each trench gate 30 fills the corresponding trench 30T that extends from the front surface 10b of the semiconductor substrate 10 toward a deep portion, and includes a gate insulating film 32 and a gate electrode 34. The trench gate 30 penetrates the corresponding source region 18 and the body region 16, and reaches the drift region 14. The source region 18 and the body region 16 are in contact with the side surface of the corresponding trench gate 30. The drift region 14 is in contact with the bottom surfaces and the side surfaces of the trench gates 30. The gate insulating film 32 is constituted of silicon oxide. The gate electrode 34 is covered with the gate insulating film 32, and constituted of polysilicon including impurities. Further, the gate electrode 34 is insulated and isolated from the source electrode 24 by a corresponding isolation insulating film 52.

The semiconductor device 1 further comprises temperature sensor portions 40 that are provided in the semiconductor substrate 10. Each temperature sensor portion 40 fills a trench 40T that extends from the front surface 10b of the semiconductor substrate 10 toward the deep portion, and is separated from the drift region 14, the source regions 18 and the trench gates 30 by the body region 16. The temperature sensor portion 40 is disposed between adjacent trench gates 30, and comprises a p$^+$-type anode region 42 and an n$^+$-type cathode region 44. The anode region 42 and the cathode region 44 constitute a pn-diode.

The anode region 42 is in contact with the cathode region 44, and is separated from the body region 16 by the cathode region 44. The cathode region 44 is in contact with the anode region 42 and the body region 16, and is separated from the drift region 14, the source regions 18 and the trench gates 30 by the body region 16. The anode region 42 is constituted of polysilicon including boron. The cathode region 44 is constituted of polysilicon including phosphorus. Each temperature sensor portion 40 is formed as follows: the trench 40T is formed on the front layer portion of the semiconductor substrate 10 through a dry-etching technique; n-type polysilicon is filled in the trench 40T through a CVD (chemical vapor deposition) technique; and p-type impurities are introduced into the polysilicon through an ion implantation technique thereafter. Further, the anode region 42 and the cathode region 44 are insulated and isolated from the source electrode 24 by the isolation insulating film 52.

Figure 2:
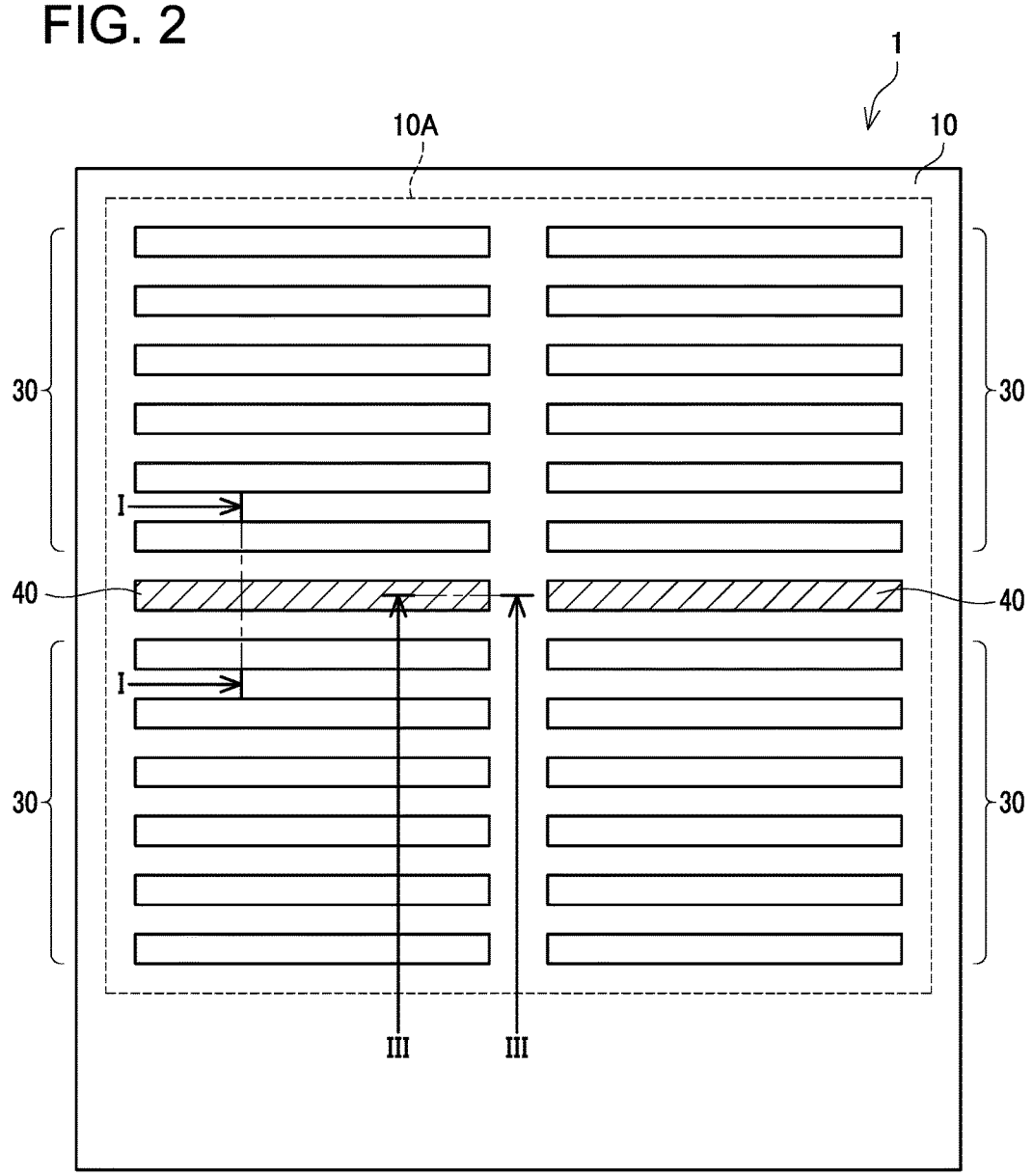
FIG. 2 is a schematic plan view of the semiconductor device disclosed herein, showing a layout of trench gates and temperature sensor portions.

As shown in FIG. 2, in a view along a direction orthogonal to the front surface 10b of the semiconductor substrate 10, each temperature sensor portion 40 is disposed at approximately a center portion of an active region 10A in which the trench gates 30 are provided, and extends along a longitudinal direction of the trench gates 30. This layout is merely one example, and the temperature sensor portions 40 may be separately arranged at a plurality of portions within the active region 10A.

Figure 3:
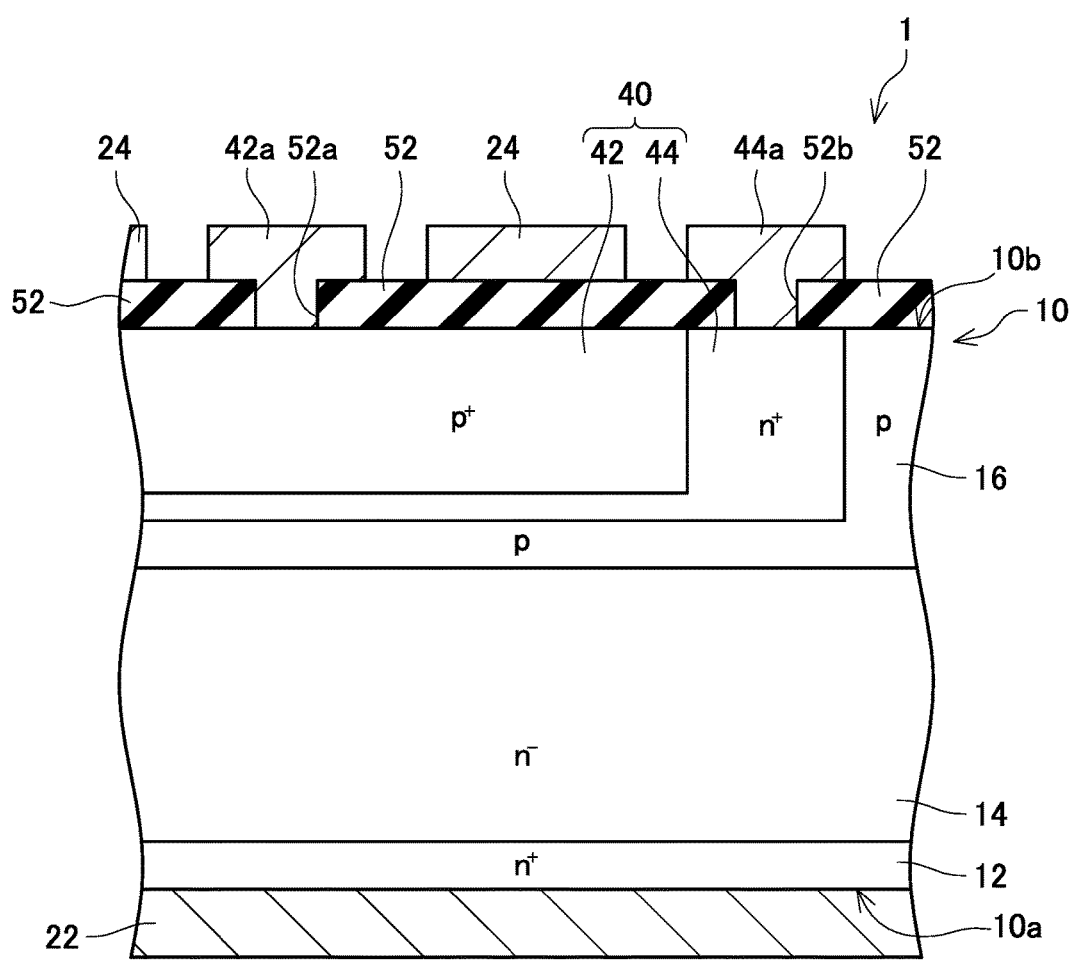
FIG. 3 schematically shows a cross section of a main part of the semiconductor device disclosed herein, taken along a line III-III of FIG. 2.

FIG. 3 shows a cross section of a main part near an end of one of the temperature sensor portions 40 in its longitudinal direction. The anode region 42 of the temperature sensor portion 40 is in ohmic contact with the anode electrode 42a at an opening 52a of the isolation insulating film 52. The cathode region 44 of the temperature sensor portion 40 is in ohmic contact with the cathode electrode 44a at an opening 52b, which is different from the opening 52a of the isolation insulating film 52. In this example, the portion where the anode region 42 is in contact with the anode electrode 42a is disposed near a center in the longitudinal direction of the temperature sensor portion 40 while the portion where the cathode region 44 is in contact with the cathode electrode 44a is disposed near the end in the longitudinal direction of the temperature sensor portion 40. This arrangement is merely one example. Alternatively, a plurality of the portions where the anode region 42 is in contact with the anode electrode 42a and a plurality of the portions where the cathode region 44 is in contact with the cathode electrode 44a may be arranged alternately along the longitudinal direction of the temperature sensor portion 40.

Next, operation of the semiconductor device 1 will be described. The semiconductor device 1 is off when a positive voltage is applied to the drain electrode 22, the source electrode 24 is grounded, and the gate electrodes 34 of the trench gates 30 are grounded. The semiconductor device 1 is on when a positive voltage is applied to the drain electrode 22, the source electrode 24 is grounded, and a voltage that is more positive than that applied to the source electrode 24 is applied to the gate electrodes 34 of the trench gates 30. At this occasion, inversion layers are formed in portions facing the side surfaces of the trench gates 30 among the body region 16 which separates the source regions 18 from the drift region 14. Electrons supplied from the source regions 18 reach the drift region 14 through the inversion layers. In this way, in the semiconductor device 1, main current flows though the drain electrode 22, the drain region 12, the drift region 14, the inversion layers in the body region 16, the source regions 18 and the source electrode 24 in this order. The semiconductor device 1 can perform repeated switching operations between on and off in accordance with the voltage that is applied to the gate electrodes 34 of the trench gates 30.

Next, operation of each temperature sensor portion 40 will be described. The anode electrode 42a and the cathode electrode 44a of the temperature sensor portion 40 are connected to an external controller (not shown). The controller controls the temperature sensor portion 40 such that a voltage that is more positive than that applied to the cathode electrode 44a is applied to the anode electrode 42a, and constant current flows between the anode electrode 42a and the cathode electrode 44a. As the semiconductor device 1 performs switching operation, the temperature of the semiconductor substrate 10 rises. Consequently, forward voltage of the pn diode of the temperature sensor portion 40 changes depending on the temperature of the semiconductor substrate 10. The controller measures the forward voltage of the pn diode of the temperature sensor portion 40, and detects the temperature based on the measured forward voltage.

Each temperature sensor portion 40 of the semiconductor device 1 has a feature that the cathode region 44 is in direct contact with the body region 16 of the semiconductor substrate 10. Accordingly since no thermal resistance exists between the pn diode of the temperature sensor portion 40 and the semiconductor substrate 10, the temperature sensor portion 40 can have a high responsivity. Moreover, since reverse pn-diode is constituted between the cathode region 44 and the body region 16, current that flows through the pn diode of the temperature sensor portion 40 is suppressed from leaking into the body region 16. For this reason, inaccurate temperature detection of the temperature sensor portion 40 due to the leak current is suppressed.

Further, the semiconductor device 1 has a feature that each temperature sensor portion 40 is separated from the drift region 14, the source regions 18 and the trench gates 30 (i.e., the inversion layers of the body region 16) by the body region 16. Due to this, the main current that flows through the semiconductor substrate 1 can be suppressed from flowing into the temperature sensor portion 40. Particularly since the main current that flows in the body region 16 flows through the inversion layers formed at the side surfaces of the trench gates 30, the main current can be suppressed from flowing into the temperature sensor portion 40, which is separated from the inversion layers by the body region. Accordingly, a situation where the temperature detection becomes inaccurate due to the influence of the main current can be suppressed.

The semiconductor device 1 has still another feature that a material of the semiconductor substrate 10 is silicon carbide. The semiconductor substrate 10 of silicon carbide has a feature of having a low diffusion coefficient of impurities. Due to this, impurities included in the anode region 42 and the cathode region 44 that constitute the pn-diode of each temperature sensor portion 40 can be suppressed from diffusing into the semiconductor substrate 10. Due to this, the pn-diode of the temperature sensor portion 40 can be formed into a desired shape in spite of variations in temperature condition during the manufacturing process. Thus, the pn-diode of the temperature sensor portion 40 can have a desired temperature detection property in spite of variations in the temperature condition during the manufacturing process. In this way, the employment of silicon carbide as a material of the semiconductor substrate 10 can allow the semiconductor device 1 to have a stable temperature detection property even though the pn-diode of the temperature sensor portion 40 is in direct contact with the semiconductor substrate 10.

Further, since the employment of the semiconductor substrate 10 constituted of silicon carbide can suppress the impurities included in the anode region 42 and the cathode region 44 that constitute the pn-diode from diffusing into the semiconductor substrate 10, the temperature sensor portions 40 can be provided in a small area in the semiconductor substrate 10. As shown in FIG. 1, in the semiconductor device 1, each temperature sensor portion 40 can be disposed in a narrow region between adjacent trench gates 30. In other words, even when the temperature sensor portions 40 are provided, a pitch width between adjacent trench gates 30 can be narrowed. Due to this, the temperature sensor portions 40 can be mounted while increase in on-resistance due to decrease in the active region 10A of the semiconductor device 1 is suppressed.

Some of technical features disclosed herein will be listed hereinbelow. It should be noted that respective matters below can have technical usefulness solely.

As a semiconductor device disclosed herein, a MOSFET (Metal Oxide Semiconductor Field Effect Transistor) or an IGBT (Insulated Gate Bipolar Transistor) may be exemplified. One embodiment of these semiconductor devices may comprise a semiconductor substrate of silicon carbide and a temperature sensor portion. The semiconductor substrate may include a portion in which a drift region of an n-type and a body region of a p-type are laminated. Another region may be disposed between the drift region and the body region. The temperature sensor portion may be disposed in the semiconductor substrate and may be separated from the drift region by the body region. The temperature sensor portion may comprise a cathode region of the n-type and an anode region of the p-type. The cathode region may be in contact with the body region. The anode region may be separated from the body region by the cathode region.

The semiconductor device according to the above-described embodiment may further comprise a plurality of trench gates, each of the trench gates penetrating the body region and reaching the drift region. In this case, the temperature sensor portion may be located between adjacent trench gates and may be separated from the trench gates by the body region. The temperature sensor portion according to the above embodiment can be disposed in a small area in the semiconductor substrate due to the effect of suppressing impurities from diffusing by the employment of the semiconductor substrate of silicon carbide. Due to this, the temperature sensor portion according to the above embodiment can be disposed in a narrow portion between adjacent trench gates. Consequently, the semiconductor device according to the above embodiment can comprise a temperature sensor portion while suppressing increase in on-resistance.

Specific examples of the art disclosed herein have been described in detail, however, these are mere exemplary indications and thus do not limit the scope of the claims. The art described in the claims include modifications and variations of the specific examples presented above. For example, the following modifications may be implemented. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
    a semiconductor substrate of silicon carbide, wherein the semiconductor substrate includes a portion in which an n-type drift region and a p-type body region are laminated through an epitaxial growth technique by depositing the n-type drift region on the semiconductor substrate and then by depositing the p-type body region on the n-type drift region; and
    a temperature sensor portion disposed in the semiconductor substrate and separated from the drift region by the body region,
    wherein the body region extends from the temperature sensor portion through the areas having a plurality of trench gates, and
    wherein the temperature sensor portion comprises:
        an n-type cathode region being in contact with the body region; and
        a p-type anode region separated from the body region by the cathode region.

2. The semiconductor device according to claim 1, further comprising
    the plurality of trench gates, wherein each of the trench gates penetrates the body region and reaches the drift region,
    wherein the temperature sensor portion is located between adjacent trench gates and is separated from the trench gates by the body region.

* * * * *